United States Patent
Grieff

(10) Patent No.: US 8,829,335 B2
(45) Date of Patent: Sep. 9, 2014

(54) THERMALLY RESISTANT SPACERS FOR A SUBMICRON GAP THERMO-PHOTO-VOLTAIC DEVICE AND METHOD

(75) Inventor: Paul Grieff, Wayland, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 71 days.

(21) Appl. No.: 13/068,207

(22) Filed: May 5, 2011

(65) Prior Publication Data

US 2011/0209748 A1   Sep. 1, 2011

Related U.S. Application Data

(63) Continuation of application No. 10/895,762, filed on Jul. 21, 2004, now abandoned.

(51) Int. Cl.
*H01L 31/058* (2006.01)
*H01L 31/04* (2014.01)

(52) U.S. Cl.
CPC ............. *H01L 31/0406* (2013.01); *Y02E 10/50* (2013.01)
USPC ........................................................ 136/253

(58) Field of Classification Search
USPC ......................................................... 136/253
See application file for complete search history.

(56) References Cited

U.S. PATENT DOCUMENTS

| | | |
|---|---|---|
| 5,075,763 A | 12/1991 | Spitzer et al. |
| 5,611,870 A | 3/1997 | Horne et al. |
| 6,232,546 B1 | 5/2001 | DiMatteo et al. |
| 6,284,969 B1 | 9/2001 | Fraas et al. |
| 6,423,896 B1 | 7/2002 | Keegan |
| 6,910,671 B1 | 6/2005 | Norkus et al. |
| 7,390,962 B2 | 6/2008 | Greiff et al. |
| 2004/0231717 A1 | 11/2004 | Greiff et al. |

OTHER PUBLICATIONS

DiMatteo et al., Micron-gap ThermoPhotoVoltaics (MTPV), (2003) AIP Conf. Proc. 653, 232. (9 pages).

*Primary Examiner* — Jennifer Michener
*Assistant Examiner* — Dustin Q Dam
(74) *Attorney, Agent, or Firm* — Edwards Wildman Palmer LLP; Ralph A. Loren; George N. Chaclas

(57) ABSTRACT

A micron gap thermo-photo-voltaic device including a photovoltaic substrate, a heat source substrate, and a plurality of spacers separating the photovoltaic substrate from the heat source substrate by a submicron gap. Each spacer includes an elongated thin-walled structure disposed in a well formed in the heat source substrate and having a top surface less than a micron above the heat source substrate. Also disclosed are methods of making the spacers.

20 Claims, 6 Drawing Sheets

THERMALLY RESISTANT SPACERS FOR A SUBMICRON GAP THERMO-PHOTO-VOLTAIC DEVICE AND METHOD

RELATED APPLICATIONS

This application is a continuation of prior U.S. patent application Ser. No. 10/895,762 filed Jul. 21, 2004 now abandoned which is hereby incorporated by reference herein, and to which this application claims the benefit of and priority to under 35 U.S.C. §§119, 120, 363, 365, and 37 C.F.R. §1.55 and §1.78.

FIELD OF THE INVENTION

This invention relates to a micron gap thermo-photo-voltaic device.

BACKGROUND OF THE INVENTION

In a thermo-photo-voltaic device, a thermal heat source is mated with a III-V photovoltaic cell. Thermal photons are radiated from the heat source and those with energy greater than the bandgap of the photovoltaic cell will generate electricity in the same manner as the more familiar solar cell. A micron-gap thermo photovoltaic device operates in similar fashion except the heat source and the photovoltaic device are separated by a gap of less than one micron. See the paper entitled "Micron-gap ThermoPhoto Voltaic (MTPV)", DiMatteo et al., proceedings of the Fifth TPV Conference, 2002 incorporated herein by this reference.

For experimental purposes, the heat source is a heater chip which is heated with an on-board electrical resistance heater but in application the heat could be derived from solar energy, combustion of fuel, or the like. In one application, the system consists of a photovoltaic cell, a heat source substrate and the heat source itself. The function of the heat source substrate is to form a high temperature radiating surface at a distance less than one micron from the photovoltaic surface. The thermal energy is applied to the back of the heat source substrate by convection or radiation. Various researchers have been looking at conventional TPV technology for about 50 years. The applicants' approach is unique is that the heat source is spaced from the photovoltaic cell by a gap of less than a micron. This micron gap spacing gets around Plank's law and allows the system to function as though the black body emissivity were greater than one. A factor of ten has been predicted and observed for 0.1 micron gaps. That is, the photocurrent obtained with a 0.1 micron spacing is about ten times that obtained when the heater chip is moved about two microns or more away from the photovoltaic cell. This is a very large effect and has the potential to revolutionize the field of thermo-photo-voltaics. For a given temperature of operation, one can decrease the size of the overall system and still achieve the same power or one could operate at a lower temperature easing materials problems and helping to make the use of thermo-photo-voltaics more practical.

To avoid thermal shorting, the system operates in a vacuum and spacers of silicon dioxide are employed to set the gap between the heater source and the photovoltaic cell in a manner which minimizes the heat transfer through the spacers. Phonons or non radiated energy carriers are a source of inefficiency as they transfer energy from the source but do not have the individual potential energy to excite electrons across the bandgap.

As described in the above referenced paper, the previous method of forming the spacers between the heat source and the photovoltaic cell was to grow a thick oxide on the heater chip and pattern the spacers to be about six microns in diameter. One disadvantage of this former method is that the spacers permit too large a heat loss from the heater. Despite the fact that the diameter of the spacers is small and the thermal resistance of silicon dioxide is greater than that of silicon, about 30% to 50% of the parasitic heat loss from the heater is due to these spacers. Typically, spacers are used in the four corners of the heater and there are at least three spacers per location. A high heat loss means that the efficiency of conversion of heat to electricity is low and also the cooling requirements on the photovoltaic cell are increased.

Another disadvantage is that the spacers can cause damage to the photovoltaic cell surface. Since the etching of the silicon dioxide is isotropic, the spacers are etched inwards at the surface. The base of the spacers is the mask dimension, about six microns. However, the tops of the spacers are narrowed to about two microns. The small size of the tips of the spacers causes the spacers to dig into certain photovoltaic cells because the material is relatively soft. Also, pressure applied to the heater/photovoltaic cell assembly can break the spacers causing debris and limiting the effectiveness of the spacers.

Another disadvantage relates to the eventual use of micron gap thermo-photo-voltaic devices for generating power which requires large area devices. One method of building a large area working system of heaters on the photovoltaic surface is to braze individual heater chips down on the photovoltaic cell creating a "tiled" surface. See U.S. Pat. No. 6,232,546 incorporated herein by this reference. A single large heater chip cannot be used because the heater is operated at about 1000° C. and the photovoltaic cell must be kept at room temperature to function effectively as a collector of photons and a generator of electrons. The difference in thermal expansion between the heater and the photovoltaic cell as the heater chip is heated from room temperature to 1000° C. can break the spacers or distort the geometry during the temperature excursion if there is a rigid attachment. This necessitates the use of tiling and the issue now becomes how to attach the heater tiles to the photovoltaic cell without creating a thermal short. With the tips of the spacers at 2 to 6 microns in diameter, there may not be enough room for the deposition of sufficient braze material to make this a practical method of attaching the heater chips to the photovoltaic cell.

SUMMARY OF THE INVENTION

It is therefore an object of this invention to provide a micron gap thermo-photo-voltaic device.

It is a further object of this invention to provide a method of making spacers for a micron gap thermo-photo-voltaic device.

It is a further object of this invention to provide spacers with increased thermal resistance.

It is a further object of this invention to provide a micron gap thermo-photo-voltaic device with increased thermal efficiency.

It is a further object of this invention to provide for precise and uniform setting of the gap dimension between the photovoltaic substrate and the heat source substrate.

It is a further object of this invention to provide spacers which are rugged, durable, and strong in compression.

It is a further object of this invention to provide spacers having a geometry which does not damage the photovoltaic substrate.

The invention results from the realization that conventional photolithography processes can be employed in a novel way to provide an elongated thin walled spacer disposed in a well formed in the heat source substrate. The top surface of the thin walled structure is less than a micron above the heat source substrate defining a submicron gap between the heat source and the photovoltaic. The well surrounding the thin walled structure thermally isolates the thin walled structure from the heat source. No longer is the length of the spacer dictated by the thickness of the deposited or grown spacer material.

The subject invention, however, in other embodiments, need not achieve all these objectives and the claims hereof should not be limited to structures or methods capable of achieving these objectives.

This invention features a micron gap thermo-photo-voltaic device comprising a photovoltaic substrate, a heat source substrate, and a plurality of spacers separating the photovoltaic substrate from the heat source substrate by a submicron gap. Each spacer includes an elongated thin-walled structure disposed in a well formed in the heat source substrate and having a top surface less than a micron above the heat source substrate.

Each spacer top surface optionally includes a flange extending radially outward from the thin-walled structure. In one embodiment, the heat source substrate is made of silicon, and the spacer is made of silicon dioxide or a dielectric material such as zirconia. In one example, the thin-walled structure is in the shape of a cylinder, the well is cup shaped and is greater than 15 microns deep and 15 microns wide.

A method of making a spacer separating a photovoltaic substrate from a heat source by a submicron gap, in accordance with this invention, includes forming a well in the heat source substrate, growing or depositing a thermally resistant material on the surface of the well, and enlarging the well to form an elongated thin-walled structure disposed in the well having a top surface less than a micron above the heat source substrate.

The well may be formed by photolithography processes and plasma etching to have a depth greater than 15 microns and a width greater than 15 microns. In one example, thermally resistant material is silicon dioxide grown on the surface of the well to a thickness of greater than 0.5 microns. The step of enlarging the well may include etching and, in one example, an anisotropic etch is used. In the preferred embodiment, a recess is formed in the heat source substrate by etching and the deep well is formed in recess. The thermally resistant material is grown or deposited to a thickness greater than the depth of the recess and patterned in the vicinity of the well to form a flange in the recess.

In another example, the thermally resistant material is a dielectric deposited on the surfaces of the well. In one embodiment, the dielectric is zirconia. The surface of the heat source substrate is etched so that the thermally resistant material extends above the surface of the heat source substrate.

In accordance with another example, the subject invention includes a plurality of spacers separating a first substrate from a second substrate by a gap. Each spacer includes an elongated thin-walled structure disposed in a well formed in one of the first and second substrates and having a top surface above the substrate. In one example, the first substrate is a photovoltaic substrate, the second substrate is a heat source substrate, and the well is formed in the heat source substrate.

One method of making a spacer separating a first substrate from a second substrate in accordance with the subject invention features forming a well in one substrate, growing or depositing a thermally resistant material on the surface of the well, and enlarging the well to form an elongated thin-walled structure disposed in the well having a top surface above the substrate. In one example, the first substrate is a photovoltaic substrate, the second substrate is a heat source substrate, and the well is formed in the heat source substrate.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
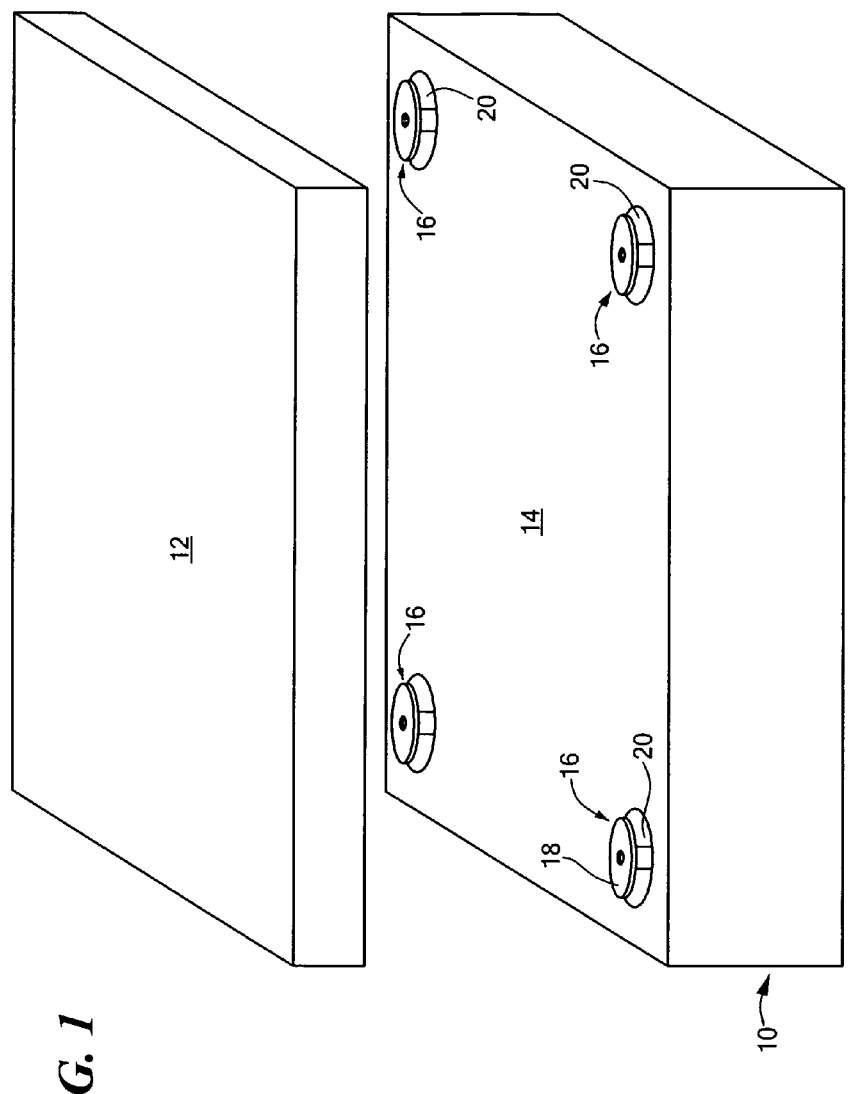
FIG. 1 is a schematic three-dimensional exploded view of a micron gap thermo-photo-voltaic device in accordance with the subject invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Micron gap thermo-photo-voltaic device 10, FIG. 1, in accordance with one embodiment of the subject invention, includes photovoltaic substrate 12, heat source substrate 14, and spacers 16 which separate substrate 12 from substrate 14 by a submicron gap. Each spacer is an elongated thin-walled structure (e.g., a hollow cylinder) disposed in well 20 formed in substrate 14. The top surface of each thin-walled spacer, typically in a form of flange 18 extending radially outward from the thin-walled structure, is preferably less than a micron above the substrate to define a gap of less than a micron between substrate 14 and substrate 12.

In one embodiment, heater source substrate 14 is made of silicon and spacers 16 are made of silicon dioxide. In another embodiment, however, spacers 16 are made of another thermally resistant material, e.g., a dielectric material such as zirconia. Wells 20 are typically cup-shaped and greater than 15 microns deep and 15 microns wide. In one example, each well 20 is 20 microns deep and over 20 microns wide. The wall thickness of the thin-walled spacer is typically on the order of about 1.0 microns. The gap height defined by the distance between the top of flange 18 and the top of substrate 14, in one example, was 0.2 microns. The thermal resistance of each spacer 16 is proportional to the length of the cylinder divided by its cross-sectional area. In this example, the cross-sectional area of the spacer wall is five times that of a single prior art six-micron diameter spacer and the thermal resistance is four times greater. When a single spacer 16, in accordance with this invention, is compared to the use of three prior art spacers per location, the thermal resistance of spacers 16 is twelve times greater.

Figure 2A:
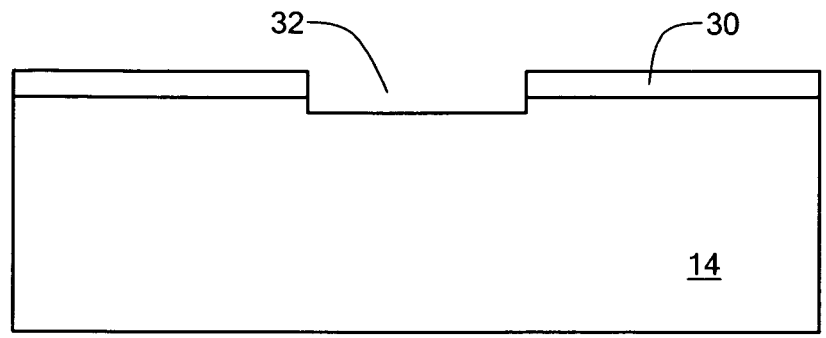
FIGS. 2A-2F are schematic cross-sectional views depicting the primary steps associated with one method of making a spacer separating a photovoltaic substrate from a heat source substrate in accordance with the subject invention.
Figure 2B:
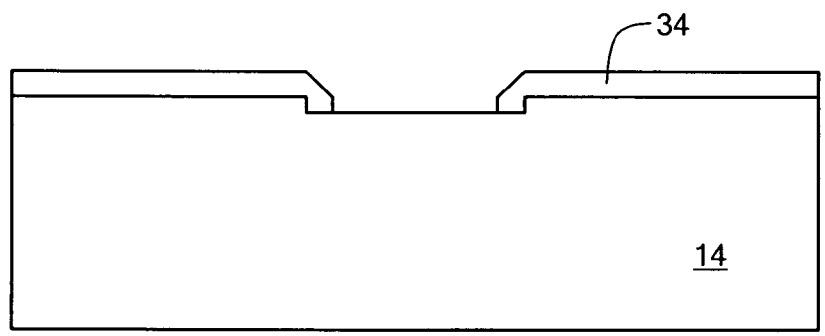
Figure 2C:
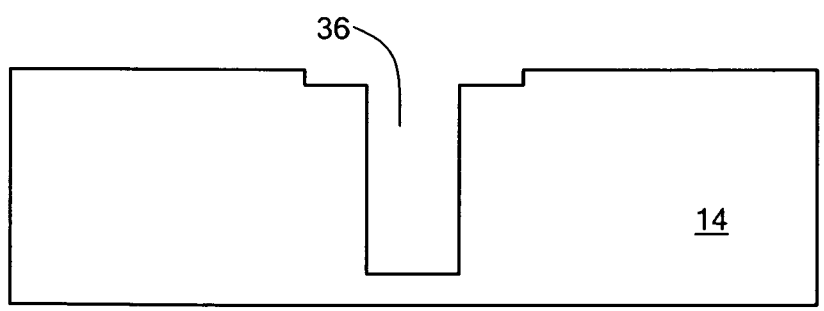
Figure 2D:
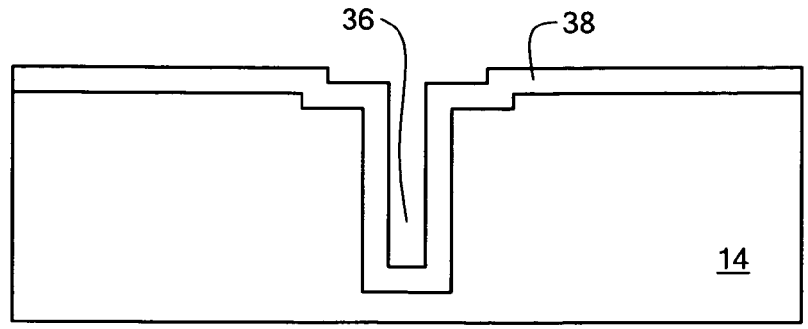
Figure 2E:
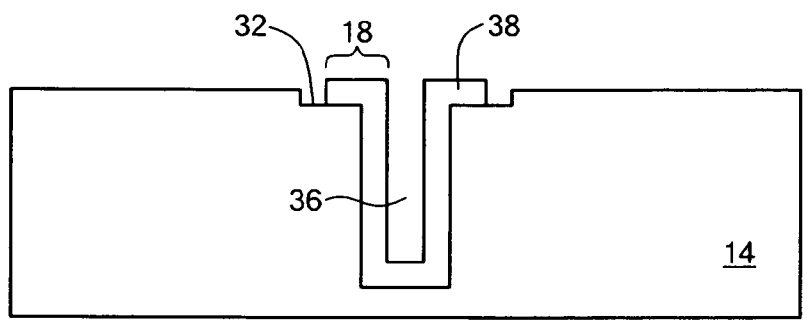
Figure 2F:
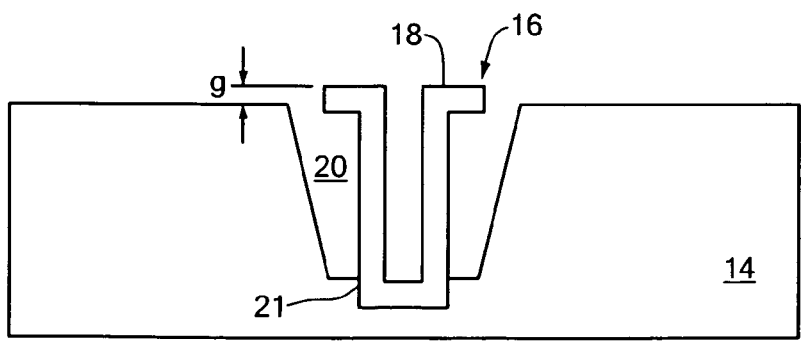

One exemplary method of making spacer 16, FIG. 1 is depicted in FIGS. 2A-2F. In FIG. 2A, photoresist 30 has been applied to substrate 14 and patterned using photolithography and silicon plasma etch processing to form shallow recess 32 in the area where a spacer is to be located. The depth of recess 32 should be precise because it is one of the two factors that will determine the height of the resulting spacer over the surrounding silicon of substrate 14 which in turn becomes the gap between the heater substrate and the photovoltaic substrate. Recess 32 maybe formed by plasma etching or by KOH etching with an oxide mask protecting the silicon. In FIGS. 2B-2C, photoresist 34 and photo-patterning and plasma etching is used to create well 36 nominally 20 microns wide and 20 microns deep in substrate 14. A wide latitude is possible for these dimensions depending on a trade off of thermal resistance and spacer ruggedness. The dimensions of well 36 do not affect the gap dimension discussed above. In FIG. 2D, silicon dioxide oxide layer 38 is grown to a thickness of greater than 0.5 microns, typically about 1.0 microns but in any case greater than the depth of recess 32. The thickness of the oxide layer 38 is the second factor which determines the gap as discussed below. Typically, the thickness of the oxide layer 38 is very uniform over all the contours in the surface of substrate 14. In FIG. 2E, oxide 38 has been patterned in the vicinity of well 36. Preferably, a thick resist (not shown) is used because it is easier to fill well 36 with resist rather than try to get the resist to cover the steep walls of the well. The size of the resulting flange 18 has no effect on either the gap or the thermal performance of the spacer. A large flange is more convenient when using a deposited braze in order to secure the heater substrate to the photovoltaic substrate and a smaller flange is typically more rugged. One requirement for accurate gap dimension, however, is that the flange terminate within recess 32. FIG. 2F shows the completed spacer 16. A metal film, not shown, is deposited on substrate 14 and patterned using a resist. A selective etchant such as EDP or TMAH is used to etch away the silicon from the immediate vicinity of spacer 18 to form well 20 without etching the silicon dioxide material of the spacer and then the metal film is removed. The size of the area of silicon removed is not a significant factor. Anisotropic etchants can be used for this etch although any silicon etch that does not attack silicon dioxide rapidly may also be used. The height of gap g, FIG. 2F is determined by the thickness of the oxidation 38, FIG. 2D less the depth of recess 32, FIG. 2A. For the nominal dimension used in this example, the gap will be 0.2 microns above the silicon outside the area of the recess. Note that spacer 18 is anchored in substrate 14 as shown at 21. This method is advantageous when the deposited dielectric is not readily etched with etchants compatible with photolithography.

Figure 3A:
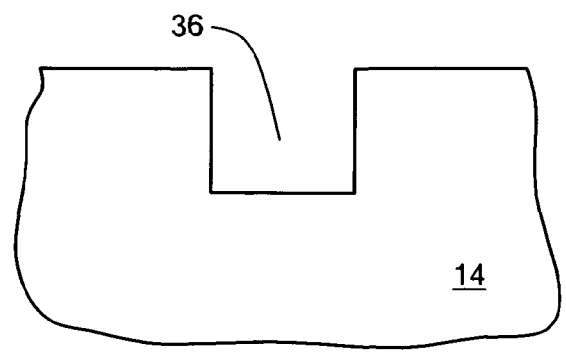
FIGS. 3A-3E are schematic cross-sectional views depicting the primary steps associated with another method of making a spacer separating a photovoltaic substrate from a heat source substrate in accordance with the subject invention.
Figure 3B:
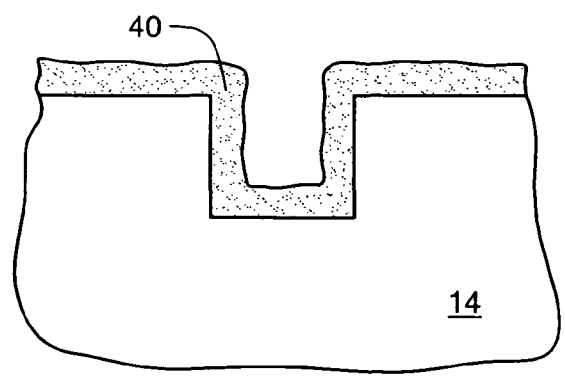
Figure 3C:
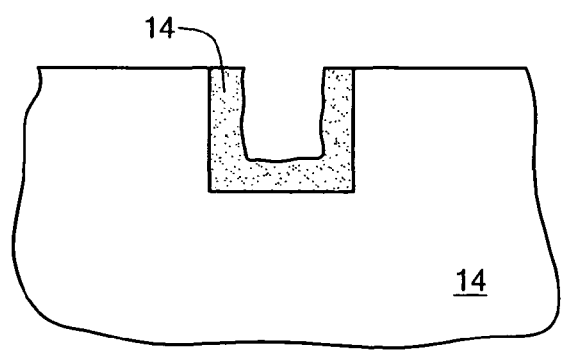
Figure 3D:
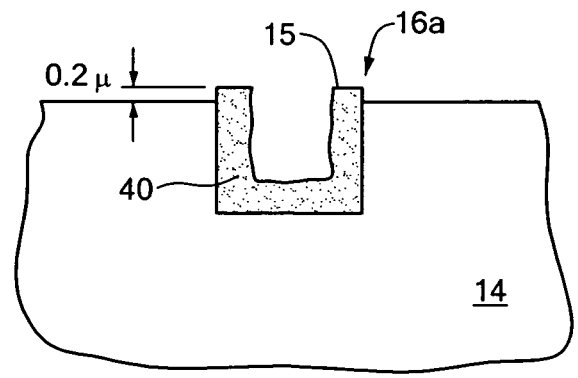
Figure 3E:
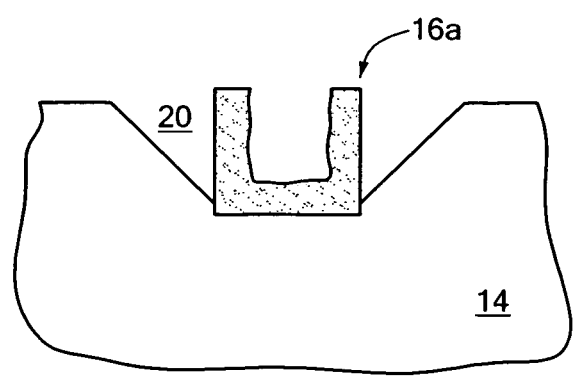

In another example, as shown in FIGS. 3A-3E, well 36 is etched in silicon substrate 14 by plasma etching to about 40 microns deep and 20 microns in diameter. In FIG. 3B, a thick layer of a dielectric such as zirconia is deposited on a surface of substrate 14 and down into well 36. Dielectric layer 40 maybe tens of microns thick and a nominal thickness example is 4 microns. In FIG. 3C, substrate 14 is planarized by polishing to form a flat surface as shown. In FIG. 3D, the silicon surface of substrate 14 is recessed by a selective etchant that does not affect dielectric 40. For the example shown, the etch-back is 0.2 microns—a depth which sets the gap between the heat source substrate and the photovoltaic substrate to give the height of the top surface 15 of spacer 16a above the top surface of substrate 14. The completed structure is shown in FIG. 3E after the silicon around spacer 16a has been etched to thermally isolate spacer 16a from substrate 14 thereby forming well 20.

Figure 4A:
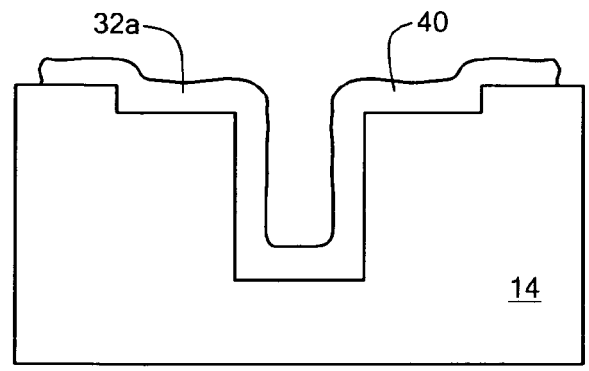
FIGS. 4A-4C are schematic cross-sectional views showing the primary steps associated with still another method of making a spacer separating a photovoltaic substrate from a heat source substrate in accordance with the subject invention.
Figure 4B:
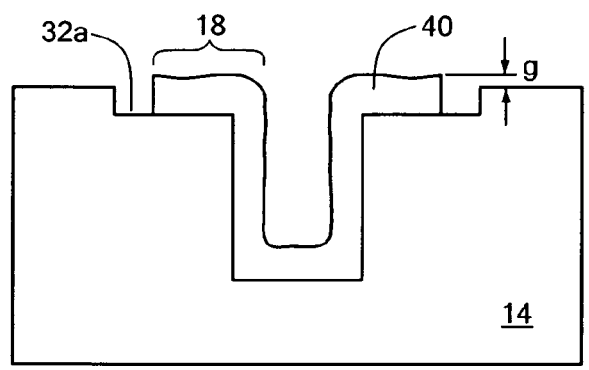
Figure 4C:
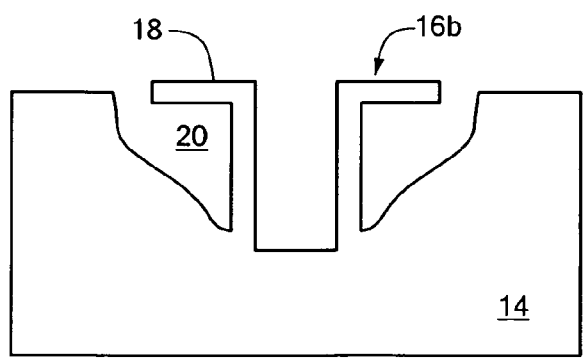

If the deposited dielectric is etch compatible with photolithography the following process may be used and a flange may also be created for a dielectric deposited in this way as shown in FIGS. 4A-4C. In FIG. 4A a deep well and recess 32a have been formed by similar techniques as in the previous processes. Dielectric 40 is now applied by deposition instead of thermal growth. This allows a wider choice of materials and thicknesses of dielectric. In FIG. 4B the flange has been etched inside the recess 32a. In FIG. 4C, the same deep etch as discussed above with referenced to FIGS. 2F and 3E is performed to form well 20.

In any embodiment, the result is a micron gap thermo-photo-voltaic device and in particular novel methods of making spacers for micron gap thermo-photo-voltaic devices. The spacers have an increased thermal resistance and the resulting micron gap thermo-photo-voltaic device has increased thermal efficiency. The methods of this invention provide for precise and uniform setting of the gap dimension between the photovoltaic substrate and the heat source substrate. The spacers of this invention are rugged, durable, and strong in compression and the spacers have a geometry which does not damage the photovoltaic substrate.

By employing conventional photolithography processes in a novel way, an elongated thin walled spacer is formed and disposed in a well in the heat source substrate. The top surface of the thin walled structure is preferably less than a micron above the heat source substrate defining a submicron gap between the heat source and the photovoltaic. The well surrounding the thin walled structure thermally isolates the thin walled structure from the heat source. No longer is the length of the spacer dictated by the thickness of the deposited or grown spacer material.

The spacer of this invention is preferably a hollow cylinder in shape and 10 to 30 or more times longer in the direction of the heat flow than the present spacers. However, since the deep well is formed by photo lithography and plasma etching, a variety of shapes other than a cylinder may be employed if deemed advantageous. The shape of the long portion of the spacer will not affect the gap obtained. The resultant structure is both larger in area and results in an order of magnitude improvement in thermal resistance. In addition, the spacer of his invention may have a flange on the edge of the cylinder that can be made arbitrarily large without affecting the thermal resistance to provide a significant area for braze attachment. Despite the large increase in size, the process for forming the spacer allows for very precise and uniform setting of the gap dimension. The new spacer formation processes result in spacers having a much greater thermal resistance. A factor of 12 is obtained with the geometry shown. Higher factors may be readily obtained. The spacers are larger in area so that spacers will not dig into softer photovoltaic surfaces and offset the gap. A large flange may be used that facilitates the placement of braze material and provides a practical method of attaching heater tiles to a large area photovoltaic without creating a low resistance thermal path. The larger cross sectional area results in greater mechanical strength in compression.

The resulting process creates a tubular dielectric spacer which is stronger and has higher thermal resistance than a spacer than can be made by just patterning dielectrics that can only be grown or deposited to a relatively short height. A precise gap to 0.1 micron or less is made by controlling a shallow recess and the oxide thickness, in spite of using a spacer 20 or more microns long. The flange on the spacer tube allows brazing or other purposes without interfering with the thermal resistance function of the spacer. The result is a practical high efficiency conversion of heat to electricity having many commercial as well as military uses.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims. For example, spacers suitable for closely separating substrates other than photovoltaic substrates and heat source substrates are within the scope of the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A thermo-photo-voltaic device comprising:
   a photovoltaic substrate;
   a heat source substrate having a planar top surface defining a plurality of wells extending down from the top surface of the heat source substrate into the heat source substrate, each well having a sidewall and a bottom; and
   a spacer anchored in each well and extending from the bottom of the well to the photovoltaic substrate, each spacer comprising:
   an elongated thin-walled structure having a top surface directed toward the photovoltaic substrate and extending above the top surface of the heat source substrate, the elongated thin-walled structure also having a lower portion below the top surface of the heat source substrate and into the heat source substrate so that the lower portion of the elongated thin-walled structure contacts the bottom and at least a portion of the sidewall of the well;
   wherein the elongated thin-walled structure provides the separation between the heat source substrate and the photovoltaic substrate.

2. The device of claim 1 in which each spacer has a top surface that includes a flange extending radially outward from the thin-walled structure.

3. The device of claim 1 in which the heat source substrate is made of silicon.

4. The device of claim 1 in which the spacer is made of silicon dioxide.

5. The device of claim 1 in which the spacer is made of a dielectric material.

6. The device of claim 5 in which the dielectric material is zirconia.

7. The device of claim 1 in which the thin-walled structure is in the shape of a cylinder.

8. The device of claim 1 in which the well is cup shaped with a central bottom recess.

9. The device of claim 1 in which the well is greater than 15 microns deep.

10. The device of claim 1 wherein said thin-walled structure is 5 microns or less in thickness.

11. The device of claim 1 wherein the spacer provides a separation of less than 1 micron between the photovoltaic substrate and the heat source substrate.

12. The device of claim 2 wherein the top of the flange is above the surface of the heat source substrate and the bottom of the flange is below the top surface of the heat source substrate.

13. The device of claim 1 wherein said thin-walled structure is hollow.

14. A thermo-photo-voltaic device comprising:
    a first monolithic substrate having a top planar side opposing a bottom planar side, the top planar side being planar and defining a plurality of wells, each well having at least one sidewall and a bottom surface enclosing the well, wherein the bottom surface defines a recess;
    an elongated spacer disposed in each well, the spacer having a top end extending above the top planar side, a bottom end, and a spacer body extending between the top end and the bottom end, wherein the bottom end is anchored in the recess of the bottom surface so that the bottom end contacts a bottom of the recess and at least a portion of the spacer body contacts a sidewall of the recess; and
    a second substrate coupled to the top end of the elongated spacer in each well to create a submicron gap between the second substrate and the first monolithic substrate, wherein one of the first monolithic substrate and the second substrate is a heat source substrate.

15. The device of claim 14, wherein the at least one sidewall and an upper portion of the spacer body form a gap therebetween.

16. The device of claim 14, wherein each spacer body is cylindrical.

17. The device of claim 14, wherein each spacer body is cylindrical and enclosed at the bottom end, and each spacer has a length of at least 15 microns.

18. The device of claim 14, wherein the bottom surface is substantially parallel to the first planar side.

19. The device of claim 14, wherein each spacer has a flange at the top.

20. A thermo-photo-voltaic device comprising:
    a first monolithic substrate having a top planar side opposing a bottom planar side, the top planar side being completely planar except for defining a plurality of features formed in the substrate, at least one of the features being a well having at least one sidewall and a bottom surface enclosing the well, wherein the bottom surface defines a recess;
    an elongated spacer disposed in the well, the spacer having a top end extending above the top planar side, a bottom end, and a spacer body extending between the top end and the bottom end, wherein the bottom end is anchored in the recess of the bottom surface so that the bottom end contacts a bottom of the recess and at least a portion of the spacer body contacts a sidewall of the recess; and
    a second substrate coupled to the top end of the elongated spacer to create a submicron gap between the second substrate and the first monolithic substrate, wherein one of the first monolithic substrate and the second substrate is a heat source substrate.

* * * * *